(12) United States Patent
Liu et al.

(10) Patent No.: US 12,495,599 B2
(45) Date of Patent: Dec. 9, 2025

(54) NITRIDE-BASED SEMICONDUCTOR DEVICE AND METHOD FOR MANUFACTURING THE SAME

(71) Applicant: INNOSCIENCE (SUZHOU) TECHNOLOGY CO., LTD., Suzhou (CN)

(72) Inventors: Yang Liu, Suzhou (CN); Xiao Zhang, Suzhou (CN); Jun Tang, Suzhou (CN); King Yuen Wong, Suzhou (CN)

(73) Assignee: INNOSCIENCE (SUZHOU) TECHNOLOGY CO., LTD., Suzhou (CN)

( * ) Notice: Subject to any disclaimer, the term of this patent is extended or adjusted under 35 U.S.C. 154(b) by 28 days.

(21) Appl. No.: 17/598,909

(22) PCT Filed: Sep. 15, 2021

(86) PCT No.: PCT/CN2021/118482
§ 371 (c)(1),
(2) Date: Mar. 23, 2023

(87) PCT Pub. No.: WO2023/039746
PCT Pub. Date: Mar. 23, 2023

(65) Prior Publication Data
US 2024/0047540 A1 Feb. 8, 2024

(51) Int. Cl.
*H10D 64/27* (2025.01)
*H01L 21/768* (2006.01)
(Continued)

(52) U.S. Cl.
CPC ..... *H10D 64/411* (2025.01); *H01L 21/76802* (2013.01); *H01L 21/76883* (2013.01);
(Continued)

(58) Field of Classification Search
CPC .... H10D 64/411; H10D 64/01; H10D 30/015; H10D 30/475; H10D 62/8503; H01L 21/76802; H01L 21/76883; H01L 23/5226
(Continued)

(56) References Cited

U.S. PATENT DOCUMENTS 6,180,440 B1   1/2001   Koganei
6,274,893 B1   8/2001   Igarashi et al.
(Continued)

FOREIGN PATENT DOCUMENTS

CN   103035702 A   3/2013
CN   111952366 A   11/2020

OTHER PUBLICATIONS

International Search Report and Written Opinion of the corresponding PCT application No. PCT/CN2021/118482 mailed on May 26, 2022.

*Primary Examiner* — Tu-Tu V Ho
(74) *Attorney, Agent, or Firm* — Li & Cai Intellectual Property (USA) Office

(57) ABSTRACT

A nitride-based semiconductor device includes a source electrode and a drain electrode, a first gate electrode, and a second gate electrode. The first gate electrode is disposed between the source electrode and the drain electrode. The first gate electrode includes a first gate bottom portion and a first gate top portion. The first gate top portion is located over the first gate bottom portion and wider than the first gate bottom portion. The second gate electrode is disposed above the first gate electrode and between the source electrode and the drain electrode. The second gate electrode includes a second gate bottom portion and a second gate top portion. The second gate bottom portion is in contact with the first gate bottom portion. The second gate top portion is
(Continued)

located over the second gate bottom portion and wider than the second gate bottom portion.

20 Claims, 8 Drawing Sheets

(51) Int. Cl.
    *H01L 23/522*     (2006.01)
    *H10D 30/01*     (2025.01)
    *H10D 30/47*     (2025.01)
    *H10D 64/01*     (2025.01)
    *H10D 62/85*     (2025.01)

(52) U.S. Cl.
    CPC ....... *H01L 23/5226* (2013.01); *H10D 30/015* (2025.01); *H10D 30/475* (2025.01); *H10D 64/01* (2025.01); *H10D 62/8503* (2025.01)

(58) Field of Classification Search
    USPC ......................................................... 257/194
    See application file for complete search history.

(56) References Cited

U.S. PATENT DOCUMENTS

| | | |
|---|---|---|
| 2014/0159116 A1 | 6/2014 | Briere et al. |
| 2016/0043209 A1 | 2/2016 | Oyama |
| 2018/0240753 A1* | 8/2018 | LaRoche ................ H10D 62/85 |
| 2019/0237569 A1* | 8/2019 | Sriram ................ H10D 64/411 |
| 2019/0371927 A1 | 12/2019 | Kajiwara et al. |

\* cited by examiner

NITRIDE-BASED SEMICONDUCTOR DEVICE AND METHOD FOR MANUFACTURING THE SAME

FIELD OF THE INVENTION

The present invention generally relates to a nitride-based semiconductor device. More specifically, the present invention relates to a nitride-based semiconductor device having a stacked gate-electrode structure.

BACKGROUND

In recent years, intense research on high-electron-mobility transistors (HEMTs) has been prevalent, particularly for high power switching and high frequency applications. III-nitride-based HEMTs utilize a heterojunction interface between two materials with different bandgaps to form a quantum well-like structure, which accommodates a two-dimensional electron gas (2DEG) region, satisfying demands of high power/frequency devices. In addition to HEMTs, examples of devices having heterostructures further include heterojunction bipolar transistors (HBT), heterojunction field effect transistor (HFET), and modulation-doped FETs (MODFET).

SUMMARY OF THE INVENTION

In accordance with one aspect of the present disclosure, a nitride-based semiconductor device is provided. The nitride-based semiconductor device includes a first nitride-based semiconductor layer, a second nitride-based semiconductor layer, a source electrode and a drain electrode, a first gate electrode, and a second gate electrode. The second nitride-based semiconductor layer is disposed on the first nitride-based semiconductor layer and has a bandgap greater than a bandgap of the first nitride-based semiconductor layer. The source electrode and a drain electrode are disposed above the second nitride-based semiconductor layer. The first gate electrode is disposed above the second nitride-based semiconductor layer and between the source electrode and the drain electrode. The first gate electrode includes a first gate bottom portion and a first gate top portion. The first gate top portion is located over the first gate bottom portion and wider than the first gate bottom portion. The second gate electrode is disposed above the first gate electrode and between the source electrode and the drain electrode. The second gate electrode includes a second gate bottom portion and a second gate top portion. The second gate bottom portion is in contact with the first gate bottom portion. The second gate top portion is located over the second gate bottom portion and wider than the second gate bottom portion.

In accordance with one aspect of the present disclosure, method for manufacturing a semiconductor device is provided. The method includes steps as follows. A first nitride-based semiconductor layer is formed on a substrate. A second nitride-based semiconductor layer is formed on the first nitride-based semiconductor layer. A first dielectric layer is formed over the second nitride-based semiconductor layer. A first opening is formed in the first dielectric layer to expose the second nitride-based semiconductor layer. A top of the first opening is widen such that first dielectric layer has a stepwise profile. A first gate electrode is formed over the first dielectric layer and has a portion within the first opening. A second dielectric layer is formed over the first gate electrode. A second opening is formed in the second dielectric. A second gate electrode is formed over the second dielectric layer and has a portion within the second opening.

In accordance with one aspect of the present disclosure, a nitride-based semiconductor device is provided. The nitride-based semiconductor device includes a first nitride-based semiconductor layer, a second nitride-based semiconductor layer, a source electrode and a drain electrode, a first gate electrode, and a second gate electrode. The second nitride-based semiconductor layer is disposed on the first nitride-based semiconductor layer and has a bandgap greater than a bandgap of the first nitride-based semiconductor layer. The source electrode and the drain electrode are disposed above the second nitride-based semiconductor layer. The first gate electrode is disposed above the second nitride-based semiconductor layer and has a width that changes stepwise from narrow to wide along an upward direction. The second gate electrode is disposed above the first gate electrode and has a width that changes stepwise from narrow to wide along the upward direction.

By applying the above configuration, the first and second gate electrodes can form a stacked gate-electrode structure. The first gate electrode can be formed from a thin blanket conductive layer such that it can avoid deformation of the blanket conductive layer during the deposition process. Accordingly, the occurrence of over etching can be reduced. The second gate electrode can be formed to compensate the thickness of the stacked gate-electrode structure, such that the stacked gate-electrode structure can have the enough thickness, avoiding damaged when it is biased. As such, the yield rate of the semiconductor device is improved since the occurrence of the over etching can be reduced, and the thickness of the stacked gate-electrode structure remains.

BRIEF DESCRIPTION OF THE DRAWINGS

Aspects of the present disclosure are readily understood from the following detailed description when read with the accompanying figures. It should be noted that various features may not be drawn to scale. That is, the dimensions of the various features may be arbitrarily increased or reduced for clarity of discussion. Embodiments of the present disclosure are described in more detail hereinafter with reference to the drawings, in which.

DETAILED DESCRIPTION

Figure 1A:
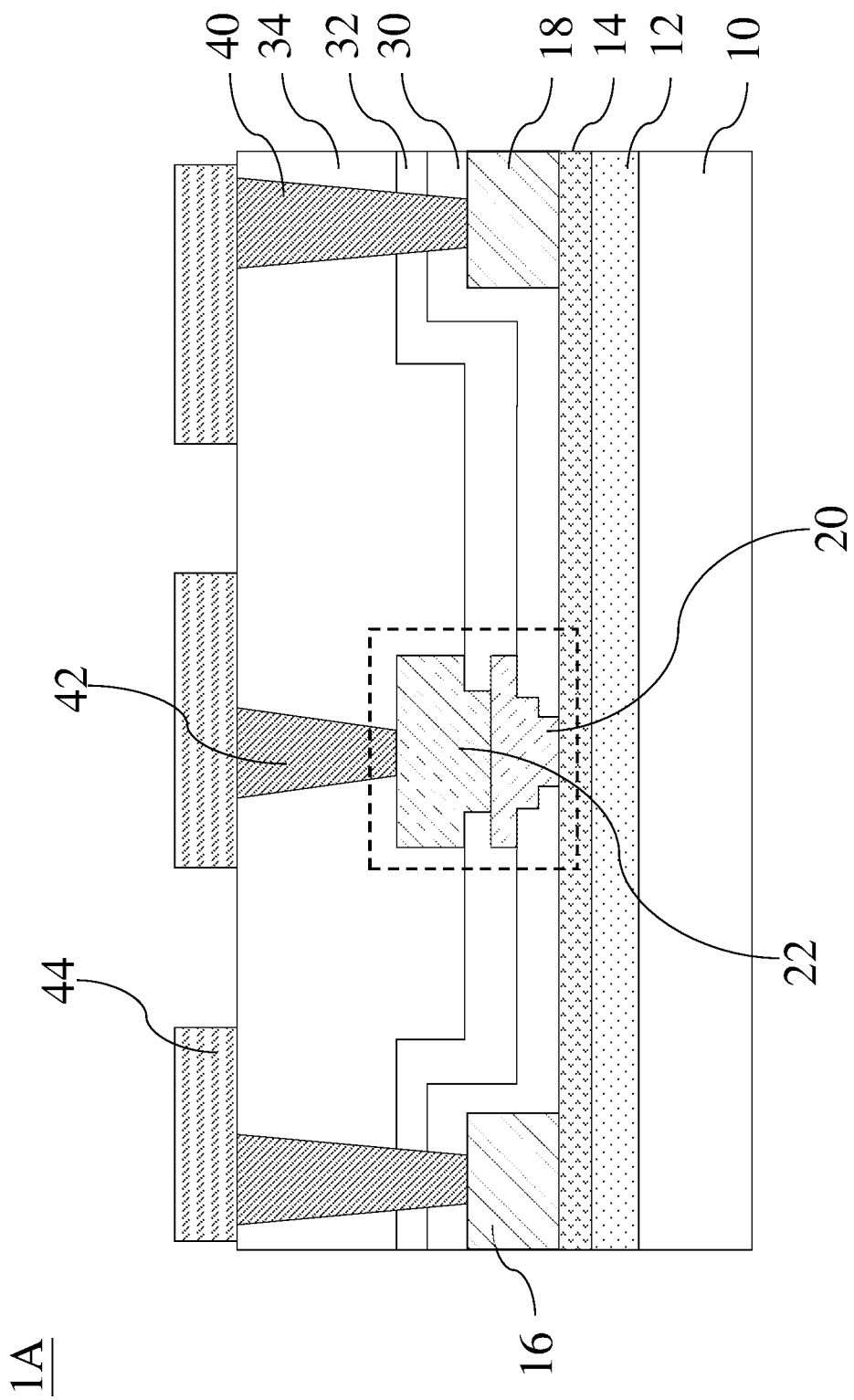
FIG. 1A is a vertical cross-sectional view of a semiconductor device according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

Spatial descriptions, such as "above," "on," "below," "up," "left," "right," "down," "top," "bottom," "vertical," "horizontal," "side," "higher," "lower," "upper," "over," "under," and so forth, are specified with respect to a certain component or group of components, or a certain plane of a component or group of components, for the orientation of the component(s) as shown in the associated figure. It should be understood that the spatial descriptions used herein are for purposes of illustration only, and that practical implementations of the structures described herein can be spatially arranged in any orientation or manner, provided that the merits of embodiments of this disclosure are not deviated from by such arrangement.

Further, it is noted that the actual shapes of the various structures depicted as approximately rectangular may, in actual device, be curved, have rounded edges, have somewhat uneven thicknesses, etc. due to device fabrication conditions. The straight lines and right angles are used solely for convenience of representation of layers and features.

In the following description, semiconductor devices/dies/packages, methods for manufacturing the same, and the likes are set forth as preferred examples. It will be apparent to those skilled in the art that modifications, including additions and/or substitutions may be made without departing from the scope and spirit of the present disclosure. Specific details may be omitted so as not to obscure the present disclosure; however, the disclosure is written to enable one skilled in the art to practice the teachings herein without undue experimentation.

FIG. 1A is a vertical cross-sectional view of a semiconductor device 1A according to some embodiments of the present disclosure. The semiconductor device 1A includes a substrate 10, nitride-based semiconductor layers 12 and 14, electrodes 16 and 18, gate electrodes 20 and 22, dielectric layers 30 and 32, a passivation layer 34, contact vias 40 and 42, and a conductive patterned layer 44.

The substrate 10 may be a semiconductor substrate. The exemplary materials of the substrate 10 can include, for example but are not limited to, Si, SiGe, SiC, gallium arsenide, p-doped Si, n-doped Si, sapphire, semiconductor on insulator, such as silicon on insulator (SOI), or other suitable substrate materials. In some embodiments, the substrate 10 can include, for example, but is not limited to, group III elements, group IV elements, group V elements, or combinations thereof (e.g., III-V compounds). In other embodiments, the substrate 10 can include, for example but is not limited to, one or more other features, such as a doped region, a buried layer, an epitaxial (epi) layer, or combinations thereof.

The nitride-based semiconductor layer 12 is disposed on/over/above the substrate 10. The nitride-based semiconductor layer 14 is disposed on/over/above the nitride-based semiconductor layer 12. The exemplary materials of the nitride-based semiconductor layer 12 can include, for example but are not limited to, nitrides or group III-V compounds, such as GaN, AlN, InN, $In_xAl_yGa_{(1-x-y)}N$ where $x+y \leq 1$, $Al_xGa_{(1-x)}N$ where $x \leq 1$. The exemplary materials of the nitride-based semiconductor layer 14 can include, for example but are not limited to, nitrides or group III-V compounds, such as GaN, AlN, InN, $In_xAl_yGa_{(1-x-y)}N$ where $x+y \leq 1$, $Al_yGa_{(1-y)}N$ where $y \leq 1$.

The exemplary materials of the nitride-based semiconductor layers 12 and 14 are selected such that the nitride-based semiconductor layer 14 has a bandgap (i.e., forbidden band width) greater than a bandgap of the nitride-based semiconductor layer 12, which causes electron affinities thereof different from each other and forms a heterojunction therebetween. For example, when the nitride-based semiconductor layer 12 is an undoped GaN layer having a bandgap of approximately 3.4 eV, the nitride-based semiconductor layer 14 can be selected as an AlGaN layer having a bandgap of approximately 4.0 eV. As such, the nitride-based semiconductor layers 12 and 14 can serve as a channel layer and a barrier layer, respectively. A triangular well potential is generated at a bonded interface between the channel and barrier layers, so that electrons accumulate in the triangular well, thereby generating a two-dimensional electron gas (2DEG) region adjacent to the heterojunction. Accordingly, the semiconductor device 1A is available to include at least one GaN-based high-electron-mobility transistor (HEMT).

In some embodiments, the semiconductor device 1A further includes a buffer layer (not shown). The buffer layer is disposed between the substrate 10 and the nitride-based semiconductor layer 12. The buffer layer can be configured to reduce lattice and thermal mismatches between the substrate 10 and the nitride-based semiconductor layer 12, thereby curing defects due to the mismatches/difference. The buffer layer may include a III-V compound. The III-V compound can include, for example but are not limited to, aluminum, gallium, indium, nitrogen, or combinations thereof. Accordingly, the exemplary materials of the buffer layer can further include, for example but are not limited to, GaN, AlN, AlGaN, InAlGaN, or combinations thereof.

In some embodiments, the semiconductor device 1A may further include a nucleation layer (not shown). The nucleation layer may be formed between the substrate 10 and a buffer layer. The nucleation layer can be configured to provide a transition to accommodate a mismatch/difference between the substrate 10 and a III-nitride layer of the buffer layer. The exemplary material of the nucleation layer can include, for example but is not limited to AlN or any of its alloys.

The electrodes 16 and 18 and the gate electrodes 20 and 22 are disposed on/over/above the nitride-based semiconductor layer 14. The electrodes 16 and 18 and the gate electrodes 20 and 22 can constitute a HEMT device with the 2DEG region.

The electrodes 16 and 18 are in contact with the nitride-based semiconductor layer 14. In some embodiments, the electrode 16 can serve as a source electrode. In some embodiments, the electrode 16 can serve as a drain electrode. In some embodiments, the electrode 18 can serve as a source electrode. In some embodiments, the electrode 18 can serve as a drain electrode. The role of the electrodes 16 and 18 depends on the device design.

The gate electrodes 20 and 22 are located between the electrodes 16 and 18. The electrode 16 is closer to the gate electrodes 20 and 22 than the electrode 18. That is, the electrodes 16 and 18 can be arranged as being asymmetrical about the gate electrodes 20 and 22. In some embodiments, the electrodes 16 and 18 can be arranged as being symmetrical about the gate electrodes 20 and 22. The arrangement depends on different electrical property requirements.

The gate electrode 22 is disposed on/over/above the gate electrode 20. The gate electrode 22 is in contact with the gate electrode 20. The gate electrodes 20 and 22 can collectively form a stacked gate-electrode structure. The stacked gate-electrode structure can serve as a gate access for the HEMT device.

Figure 2:
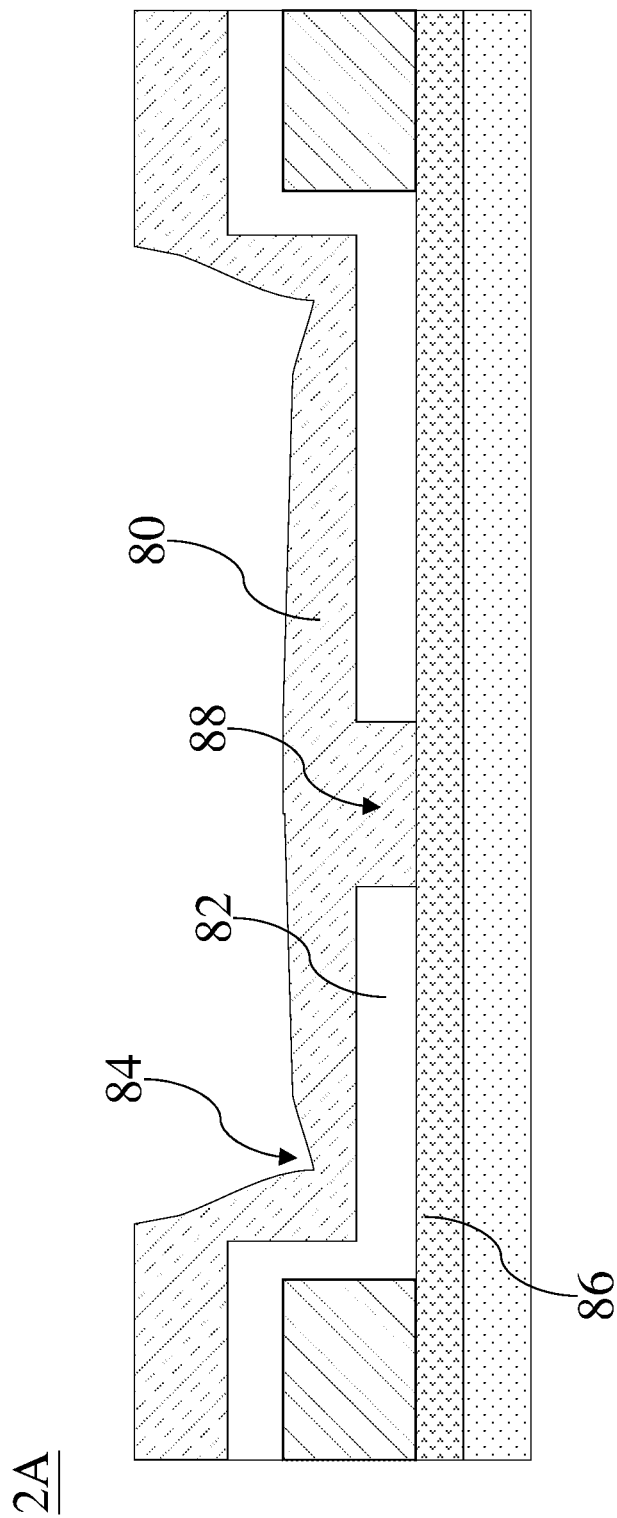
FIG. 2 is a cross-section view schematically showing a manufacturing stage for a semiconductor device according to a comparative embodiment.

The reason for using a stacked gate-electrode structure rather than a single gate metal is based on the yield rate of the formation. To illustrate, FIG. 2 is a cross-section view schematically showing a manufacturing stage for a semiconductor device 2A according to a comparative embodiment. As shown in FIG. 2, the depicted stage is formation for a gate electrode. A gate electrode can be formed by patterning a blanket conductive layer 80 on a dielectric layer 82. The blanket conductive layer 80 is conformally formed on the dielectric layer 82, and at least one turning corner 84 can be found. As the blanket conductive layer 80 is deposited to become thicker, the turning corner 84 of the blanket conductive layer 80 would get deformed. This is related to the mechanism of directional deposition.

As result, the thickness of the blanket conductive layer 80 is non-uniform. Then, after a subsequent patterning process, it is highly possible that the dielectric layer 82 beneath the turning corner 84 of the blanket conductive layer 80 is over etched. Over etching may raise morphology issue such that subsequently formed layers cannot comply with the original design. When over etching occurs heavily, a barrier layer 86 beneath the dielectric layer 82 may be damaged by the etching. Furthermore, as a gate opening 88 in the dielectric layer 82 is deep with respect to the blanket conductive layer 80, the deposition quality will get worse.

Referring to FIG. 1A again, the stacked gate-electrode structure can avoid the occurrence of the afore-mentioned issue (i.e., too thick to keep the profile of the layer), since each of the gate electrodes 20 and 22 can be formed as being thinner compared to a single gate metal. Furthermore, in order to save the number of used reticles, the profiles of the gate electrodes 20 and 22, including dimensions thereof, can be designed as corresponding with each other. More details are described as follows.

Figure 1B:
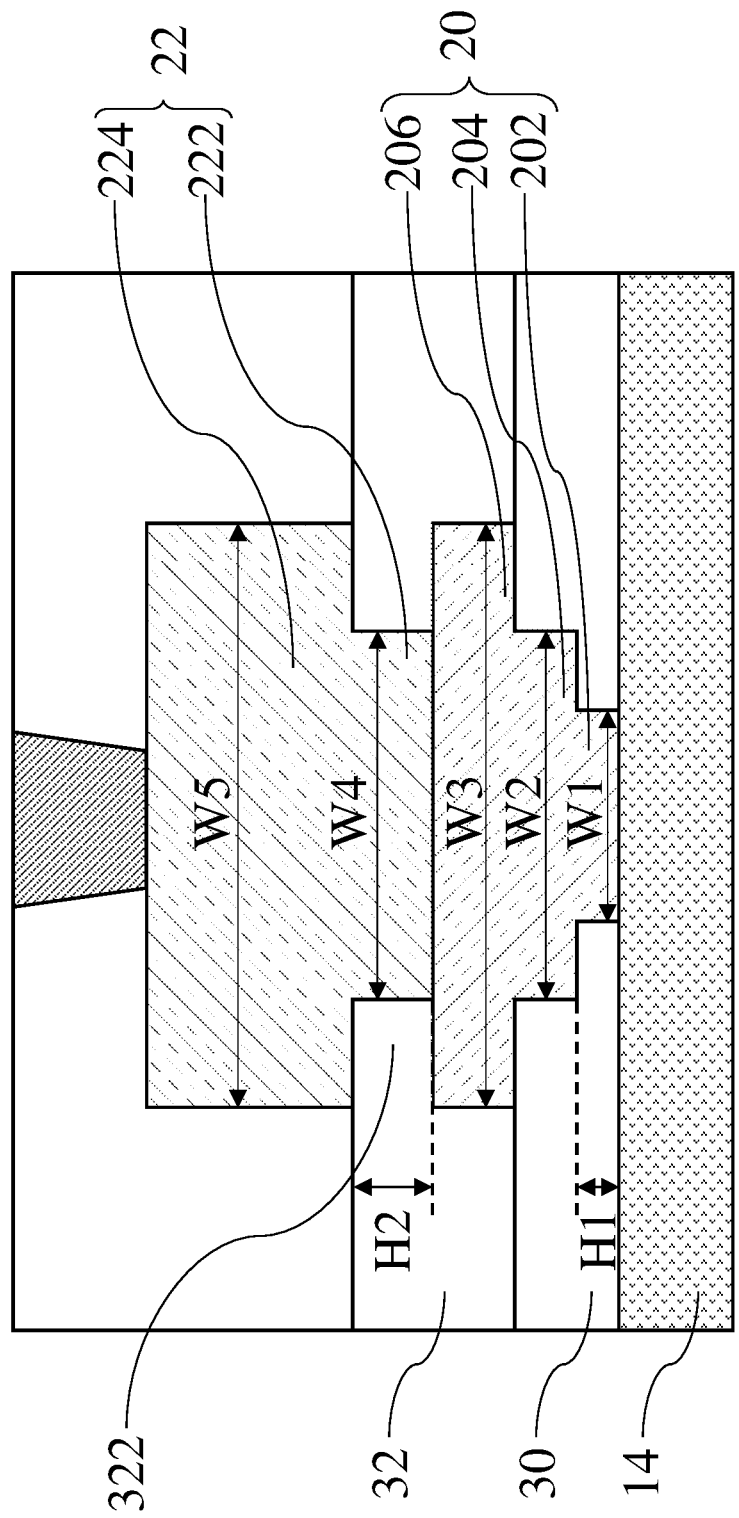
FIG. 1B is an enlarged vertical cross-sectional view of a region B in the FIG. 1A.

FIG. 1B is an enlarged vertical cross-sectional view of a region B in the FIG. 1A. The dielectric layer 30, the gate electrode 20, the dielectric layer 32, and the gate electrode 22 are stacked in sequence. The dielectric layer 30 is disposed on/over/above the nitride-based semiconductor layer 14. The gate electrode 20 is disposed on/over/above the dielectric layer 30. The dielectric layer 32 is disposed on/over/above the dielectric layer 30 and the gate electrode 20. The gate electrode 22 is disposed on/over/above the dielectric layer 32 and the gate electrode 20.

The gate electrode 20 penetrates the dielectric layer 30 to make contact with the nitride-based semiconductor layer 14. The gate electrode 20 includes a gate bottom portion 202, a gate middle portion 204, and a gate top portion 206. The gate top portion 206 is located over the gate bottom portion 202 and the gate middle portion 204. The gate middle portion 204 is located between the gate bottom portion 202 and the gate top portion 206. The gate middle portion 204 connects the gate bottom portion 202 and the gate top portion 206.

The gate top portion 206 is wider than the gate bottom portion 202. The gate middle portion 204 is narrower than the gate top portion 206. The gate middle portion 204 is wider than the gate bottom portion 202. The gate bottom portion 202 has a width labeled as width W1; the gate middle portion 204 has a width labeled as width W2; and the gate top portion 206 has a width labeled as width W3. The relationship among widths W1, W2, and W3 is W3>W2>W1. The width of the gate electrode 20 can change stepwise from narrow to wide along an upward direction.

The gate bottom portion 202 is positioned within the dielectric layer 30. The gate middle portion 204 is positioned within the dielectric layer 30. The gate top portion 206 is positioned over the dielectric layer 30. The gate bottom portion 202 and the gate middle portion 204 are positioned within a gate opening of the dielectric layer 30. Accordingly, the dielectric layer 30 can enclose the gate bottom portion 202 and the gate middle portion 204 of the gate electrode 20. Since the gate bottom portion 202 and the gate middle portion 204 have different widths, the dielectric layer 30 can form a stepwise profile at an interface with the gate bottom portion 202 and the gate middle portion 204 of the gate electrode 20.

As afore-described, a gate opening profile is related to the deposition quality. As compared with a gate opening structure without a stepwise profile, the gate middle portion 204 is deposited in a shallow depth (e.g., a depth less than the thickness of the dielectric layer 30), so the gate middle portion 204 can tend to fully fill the gate opening, which avoids the deposition quality gets worse.

The dielectric layer 32 is disposed over the dielectric layer 30. The dielectric layer 32 is disposed over the gate top portion 206 of the gate electrode 20. The dielectric layer 32 encloses the gate top portion 206 of the gate electrode 20.

The gate electrode 22 is disposed over the gate electrode 20 and the dielectric layer 32. The gate electrode 22 penetrates the dielectric layer 32 to make contact with the gate electrode 20. The gate electrode 22 includes a gate bottom portion 222 and a gate top portion 224. The gate top portion 224 is located over the gate bottom portion 222. The gate bottom portion 222 of the gate electrode 22 is in contact with the gate top portion 206 of the gate electrode 20.

The gate top portion 224 is wider than the gate bottom portion 222. The gate bottom portion 222 has a width labeled as width W4; and the gate top portion 224 has a width labeled as width W5. The relationship between the widths W4 and W5 is W5>W4. The width of the gate electrode 22 can change stepwise from narrow to wide along the upward direction.

Moreover, the gate bottom portion 222 has substantially the same width as that of the gate middle portion 204, so the relationship between the widths W2 and W4 is W2=W4. The gate top portion 206 and the gate top portion 224 have substantially the same width, so the relationship between the widths W3 and W5 is W3=W5. In some embodiments, the relationship among widths W1-W5 is W1<W2=W4<W3=W5. The greatest width of the gate electrode 20 is the same as the greatest width of the gate electrode 22. The gate middle portion 204 of the gate electrode 20 has a width the same as the smallest width of the gate electrode 22.

In this regard, the widths W2 and W4 can be defined by the dimensions of the gate openings of the dielectric layers 30 and 32. The dimensions of the gate openings of the dielectric layers 30 and 32 can be determined by applied reticles. As the widths W2 and W4 are substantially the same, the same reticle can be applied to the formation of the gate openings of the dielectric layers 30 and 32, which means no additional reticle is needed for the formation of the gate opening of the dielectric layer 32.

Moreover, the widths W3 and W5 can be determined by applied reticles for the formation of the gate electrodes 20 and 22. The formation of the gate electrodes 20 and 22 includes respective patterning processes. The reticles applied to the patterning processes can determine the widths W3 and W5. As the widths W3 and W5 are substantially the same, the same reticle can be applied to the patterning processes of the gate electrodes 20 and 22, which means no additional reticle is needed for the patterning process of the gate electrode 22.

The gate bottom portion 222 is positioned within the dielectric layer 32. The gate bottom portion 222 is positioned within a gate opening of the dielectric layer 32. Accordingly, the dielectric layer 32 can enclose the gate bottom portion 222 of the gate electrode 22. The gate top portion 224 is positioned over the dielectric layer 32.

The gate electrode 22 can serve as a compensation electrode with respect to the gate electrode 20. Since the thin gate electrode 20 may be insufficient for a thickness demand in the device design, the gate electrode 22 can compensate the gate electrode 20 for the thickness concern. That is, the gate electrode 22 can compensate the stacked gate-electrode structure for the desired thickness. In some embodiments, the gate electrode 22 is thicker than the gate electrode 20. In some embodiments, the gate electrode 20 is thinner than the gate electrode 22. The thinner gate electrode 20 can build a great morphology in the structure and then the thicker gate electrode 22 is formed for cure the thickness concern.

As concerned the deposition quality of the gate electrode 22, The gate opening of the dielectric layer 32 for accommodating the gate bottom portion 222 can be shallow. Since the gate electrode 22 is formed for compensating for the thickness, no greatly affection to the device is caused due to the shallow gate opening of the dielectric layer 32. Accordingly, the gate bottom portion 222 can have a light thickness that have the gate bottom portion 222 filling the gate opening of the dielectric layer 32 as full as possible during the deposition. In some embodiments, the gate bottom portion 202 has a height H1 less than a height H2 of the gate bottom portion 222.

Because the relationship among the widths W3, W4, and W5 is W4<W3=W5, the dielectric layer 32 has a portion 322 extending to a region between the gate top portion 206 and the gate top portion 224. The portion 322 of the dielectric layer 32 abuts against the gate bottom portion 222. The profile of the dielectric layer 32 caused by the portion 322 can secure the gate electrode 20 between the dielectric layers 30 and 32.

As shown in FIG. 1A and FIG. 1B, the dielectric layer 30 is disposed over the nitride-based semiconductor layer 14. The dielectric layer 30 covers the electrodes 16 and 18. The dielectric layer 30 extends from a top surface of the electrode 16 or 18 to a position beneath the gate top portion 206 of the gate electrode 20. The dielectric layer 32 covers the dielectric layer 30. The dielectric layer 32 extends from a position above the electrode 16 or 18 to enclose the gate top portion 206 of the gate electrode 20 and the gate bottom portion 222 of the gate electrode 22.

The position of the formed gate electrode 22 is flexible since the core purpose of the gate electrode 22 is configured to compensate the thickness of the stacked gate-electrode structure. To compensate the thickness of the stacked gate-electrode structure, the gate electrode 22 stacked on the gate electrode 20 can be in a position higher than the electrodes 16 and 18.

The widths of the gate electrodes 20 and 22 can change stepwise including being narrow to wide and wide to narrow along the upward direction, so that the gate electrodes 20 and 22 can have stepwise profiles. As compared a single gate electrode, the stepwise profiles make the stacked gate-electrode structure having enough thickness but the narrower width so as to reduce the parasitic capacitance formed with the electrodes 16 and 18. That is, the width of the stacked gate-electrode structure can be adjustable through modifying the profiles of the gate electrodes 20 and 22, in order to reduce the parasitic capacitance formed with the electrodes 16 and 18.

In some embodiments, the electrodes 16 and 18 can include, for example but are not limited to, metals, alloys, doped semiconductor materials (such as doped crystalline silicon), compounds such as silicides and nitrides, other conductor materials, or combinations thereof. The exemplary materials of the electrodes 16 and 18 can include, for example but are not limited to, Ti, AlSi, TiN, or combinations thereof. The electrodes 16 and 18 may be a single layer, or plural layers of the same or different composition. In some embodiments, the electrodes 16 and 18 form ohmic contacts with the nitride-based semiconductor layer 14. The ohmic contacts can be achieved by applying Ti, Al, or other suitable materials to the electrodes 16 and 18. In some embodiments, each of the electrodes 16 and 18 is formed by at least one conformal layer and a conductive filling. The conformal layer can wrap the conductive filling. The exemplary materials of the conformal layer, for example but are not limited to, Ti, Ta, TiN, Al, Au, AlSi, Ni, Pt, or combinations thereof. The exemplary materials of the conductive filling can include, for example but are not limited to, AlSi, AlCu, or combinations thereof.

The exemplary materials of the gate electrode 20 may include metals or metal compounds. The gate electrode 20 may be formed as a single layer, or plural layers of the same or different compositions. The exemplary materials of the metals or metal compounds can include, for example but are not limited to, W, Au, Pd, Ti, Ta, Co, Ni, Pt, Mo, TiN, TaN, Cu, Al, metal alloys or compounds thereof, or other metallic compounds.

The exemplary materials of the gate electrode 22 may include metals or metal compounds. The gate electrode 22 may be formed as a single layer, or plural layers of the same or different compositions. The exemplary materials of the metals or metal compounds can include, for example but are not limited to, W, Au, Pd, Ti, Ta, Co, Ni, Pt, Mo, TiN, TaN, Cu, Al, metal alloys or compounds thereof, or other metallic compounds.

In some embodiments, the gate electrodes 20 and 22 include different materials. For example, the gate electrode 20 includes Ni, Au, or combinations thereof and the gate electrode 22 includes Cu. The gate electrode 20 is devoid of Cu. Such the configuration is made according to the diffusion concern.

The material of each of the passivation layers 30 and 32 can include, for example but is not limited to, dielectric materials. For example, each of the passivation layers 30 and 32 can include SiNx (e.g., $Si_3N_4$), $SiO_x$, $Si_3N_4$, SiON, SiC, SiBN, SiCBN, oxides, nitrides, oxides, nitrides, plasma-enhanced oxide (PEOX), tetraethoxysilane normal abbreviation (TEOS), or combinations thereof.

The passivation layer 34 can be disposed on/over/above the gate electrode 22 and the passivation layers 30 and 32. The material of the passivation layer 34 can include, for example but is not limited to, dielectric materials. The passivation layer 34 can serve as a planarization layer which has a level top surface to support other layers/elements. In some embodiments, the passivation layer 34 can be formed as being thicker, and a planarization process, such as a chemical mechanical polish (CMP) process, is performed on the passivation layer 34 to remove the excess portions, thereby forming a level top surface. The exemplary materials of the passivation layer 34 can be identical to or similar to that of the passivation layer 30 or 32.

The contact vias 40 are disposed within the passivation layer 34. The contact vias 40 can penetrate the passivation layer 34. The contact vias 40 can extend longitudinally to connect to the electrodes 16 and 18. The upper surfaces of the contact vias 40 are free from coverage of the passivation layer 34. The exemplary materials of the contact vias 40 can include, for example but are not limited to, conductive materials, such as metals or alloys.

The contact via 42 are disposed within the passivation layer 34. The contact via 42 can penetrate the passivation layer 34. The contact vias 40 can extend longitudinally to connect to the gate electrode 22. The upper surfaces of the contact via 42 are free from coverage of the passivation layer 34. The exemplary materials of the contact vias 40 can include, for example but are not limited to, conductive materials, such as metals or alloys. In some embodiments, the contact via 42 is shorter than the contact vias 40.

The patterned conductive layer 44 is disposed on/over/above the passivation layer 34 and the contact vias 40 and 42. The patterned conductive layer 44 is in contact with the contact vias 40 and 42. The patterned conductive layer 44 may have metal lines, pads, traces, or combinations thereof, such that the patterned conductive layer 44 can form at least one circuit. Hence, the patterned conductive layer 44 can serve as a patterned circuit layer. The patterned conductive layer 44 can connect with the electrodes 16 and 18 and the gate electrode 22 by the contact vias 40 and 42, respectively. An external electronic device can send at least one electronic signal to the semiconductor device 10A by the patterned conductive layer 44, and vice versa. The exemplary materials of the patterned conductive layer 44 can include, for example but are not limited to, conductive materials. The patterned conductive layer 44 may include a single film or multilayered film having Ag, Al, Cu, Mo, Ni, Ti, alloys thereof, oxides thereof, nitrides thereof, or combinations thereof.

Different stages of a method for manufacturing the semiconductor device 1A are shown in FIG. 3A, FIG. 3B, FIG. 3C, FIG. 3D, FIG. 3E, FIG. 3F, and FIG. 3G, as described below. In the following, deposition techniques can include, for example but are not limited to, atomic layer deposition (ALD), physical vapor deposition (PVD), chemical vapor deposition (CVD), metal organic CVD (MOCVD), plasma enhanced CVD (PECVD), low-pressure CVD (LPCVD), plasma-assisted vapor deposition, epitaxial growth, or other suitable processes.

Figure 3A:
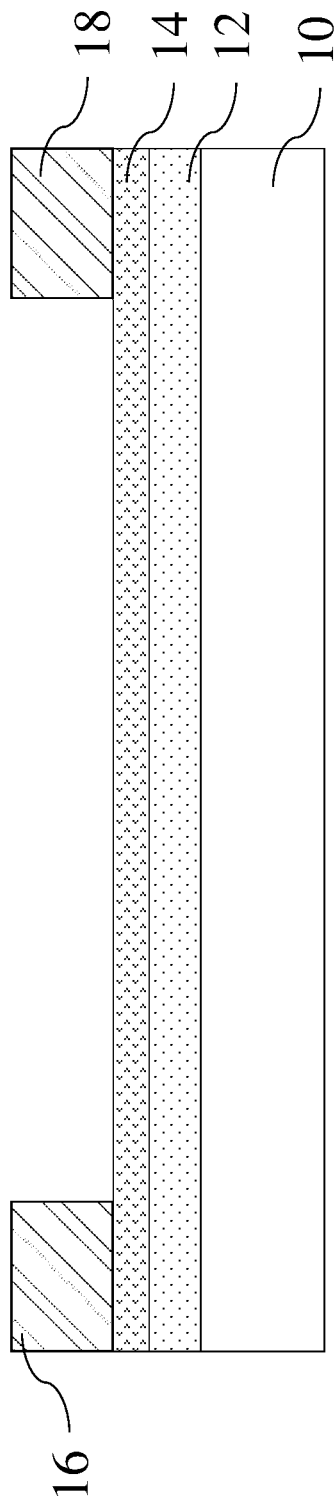
FIG. 3A, FIG. 3B, FIG. 3C, FIG. 3D, FIG. 3E, FIG. 3F, and FIG. 3G show different stages of a method for manufacturing a nitride-based semiconductor device according to some embodiments of the present disclosure.

Referring to FIG. 3A, nitride-based semiconductor layers 12 and 14 can be formed on/over/above a substrate 10 by using the above-mentioned deposition techniques. The nitride-based semiconductor layer 14 is formed on the nitride-based semiconductor layers 12. Electrodes 16 and 18 are formed on the nitride-based semiconductor layer 14. The formation of the electrodes 16 and 18 includes deposition techniques and a patterning process. In some embodiments, the patterning process can include photolithography, exposure and development, etching, other suitable processes, or combinations thereof.

Figure 3B:
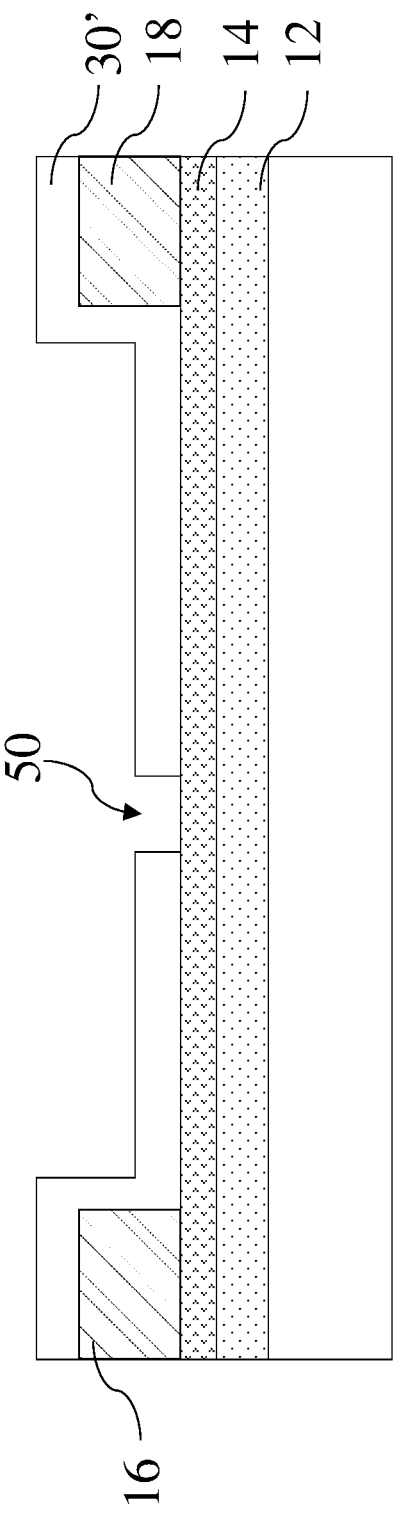

Referring to FIG. 3B, an intermediate dielectric layer 30' is formed over the nitride-based semiconductor layer 14 by using the above-mentioned deposition techniques. The intermediate dielectric layer 30' covers the electrodes 16 and 18. Thereafter, an opening 50 is formed in the intermediate dielectric layer 30' to expose the nitride-based semiconductor layer 14. In some embodiments, the formation of the opening 50 includes an etching process, including a dry etching, a wet etching, or combinations thereof.

Figure 3C:
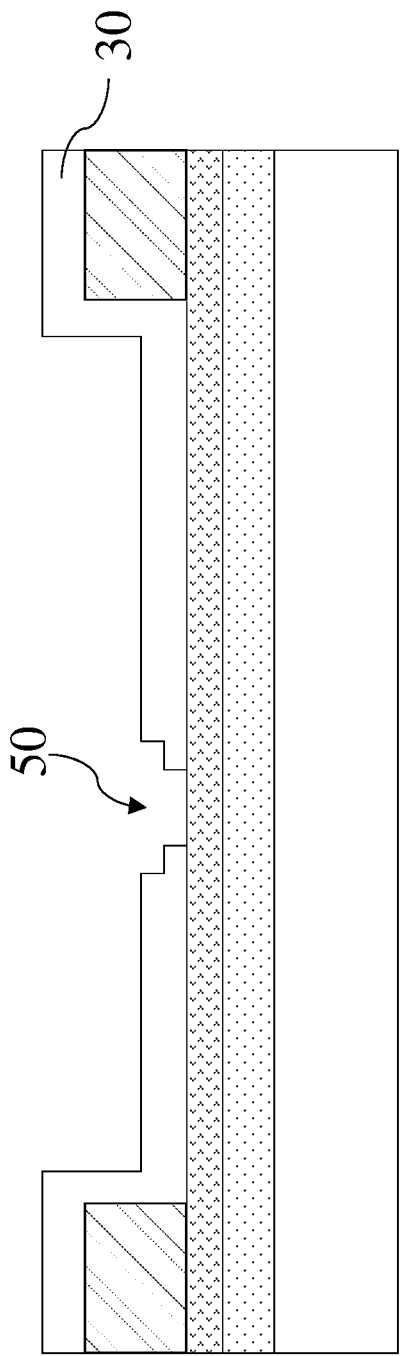

Referring to FIG. 3C, a top of the opening 50 is widened such that a dielectric layer 30 is formed with a stepwise profile. The width of the opening 50 changes from narrow to wide along the upward direction.

Figure 3D:
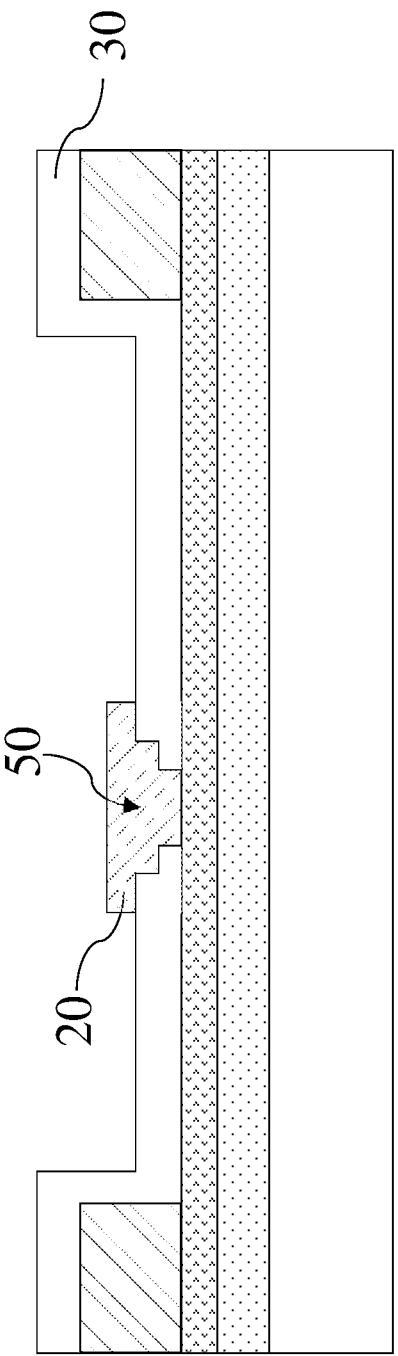

Referring to FIG. 3D, a gate electrode 20 is formed over the dielectric layer 30 with a portion thereof located within the opening 50. In some embodiments, the formation of the gate electrode 20 includes deposition techniques and a patterning process. During the patterning process, a reticle is used for defining the pattern of the gate electrode 20. Specifically, a blanket gate layer can be formed to cover the dielectric layer 30 and fill into the opening 50. Then, the blanket gate layer is patterned by using a reticle, such that the gate electrode 20 is formed.

Figure 3E:
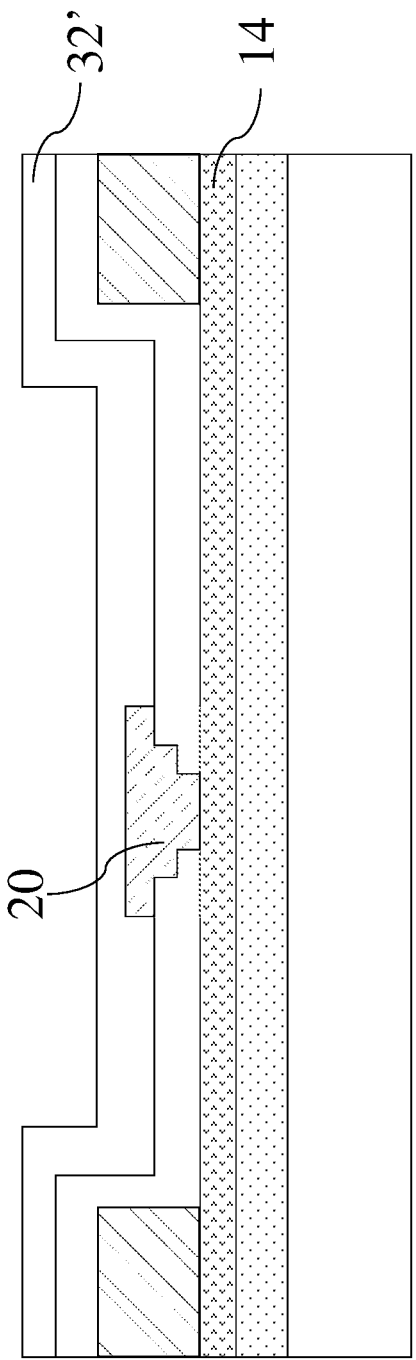

Referring to FIG. 3E, an intermediate dielectric layer 32' is formed over the nitride-based semiconductor layer 14 by using the above-mentioned deposition techniques. The intermediate dielectric layer 32' covers the dielectric layer 30 and the gate electrode 20.

Figure 3F:
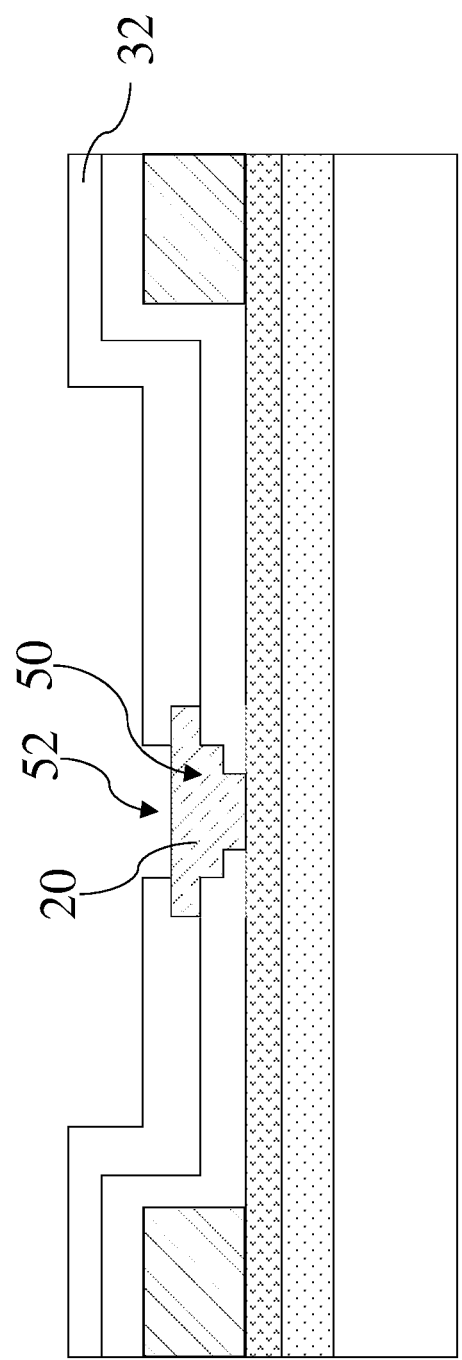

Referring to FIG. 3F, an opening 52 is formed in the intermediate dielectric layer 32' to form a dielectric layer 32. The gate electrode 20 is exposed from the opening 52 of the dielectric layer 32. In some embodiments, the formation of the opening 52 includes an etching process, including a dry etching, a wet etching, or combinations thereof. In this regard, widening the opening 50 of the formation of the dielectric layer 30 and forming the opening 52 can use the same reticle such that the widened opening 50 and the opening 52 have the same width. Therefore, the number of the required reticles can be saved.

Figure 3G:
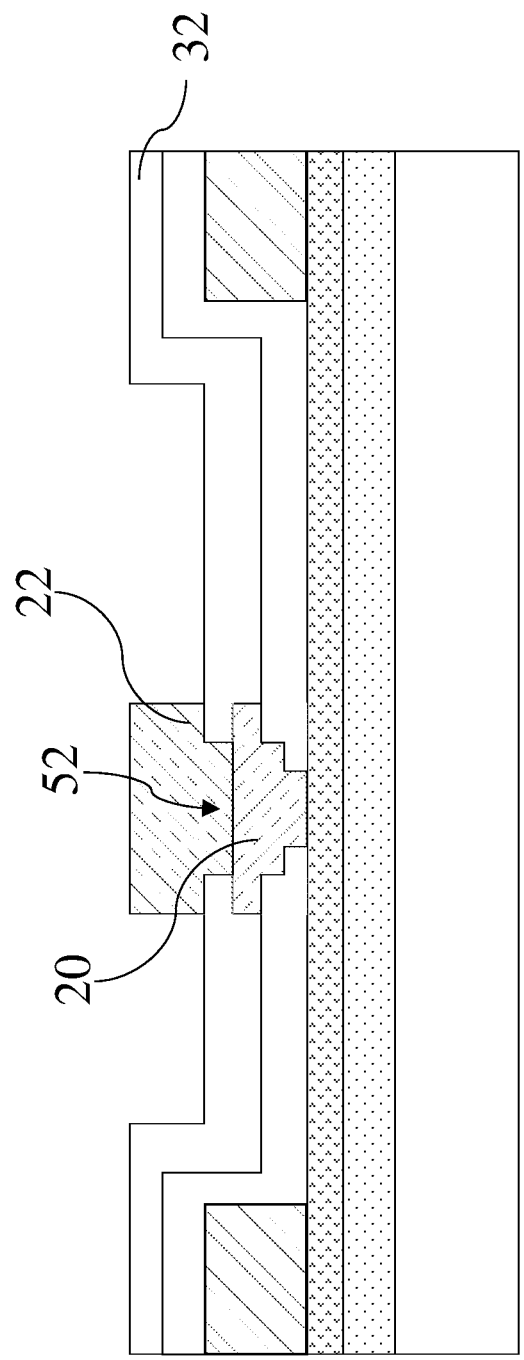

Referring to FIG. 3G, a gate electrode 22 is formed over the dielectric layer 32 with a portion thereof located within the opening 52. In some embodiments, the formation of the gate electrode 22 includes deposition techniques and a patterning process. During the patterning process, a reticle is used for defining the pattern of the gate electrode 22. Specifically, a blanket gate layer can be formed to cover the dielectric layer 32 and fill into the opening 52. Then, the blanket gate layer is patterned by using a reticle, such that the gate electrode 22 is formed. In some embodiment, the blanket gate layers for forming the gate electrodes 20 and 22 can be patterned by the same reticle to form the gate electrodes 20 and 22 having the same width. Thereafter, a passivation layer, contact vias, and a patterned conductive layer are formed on the resultant structure, so as to obtain the structure as shown in FIG. 1A.

Figure 4:
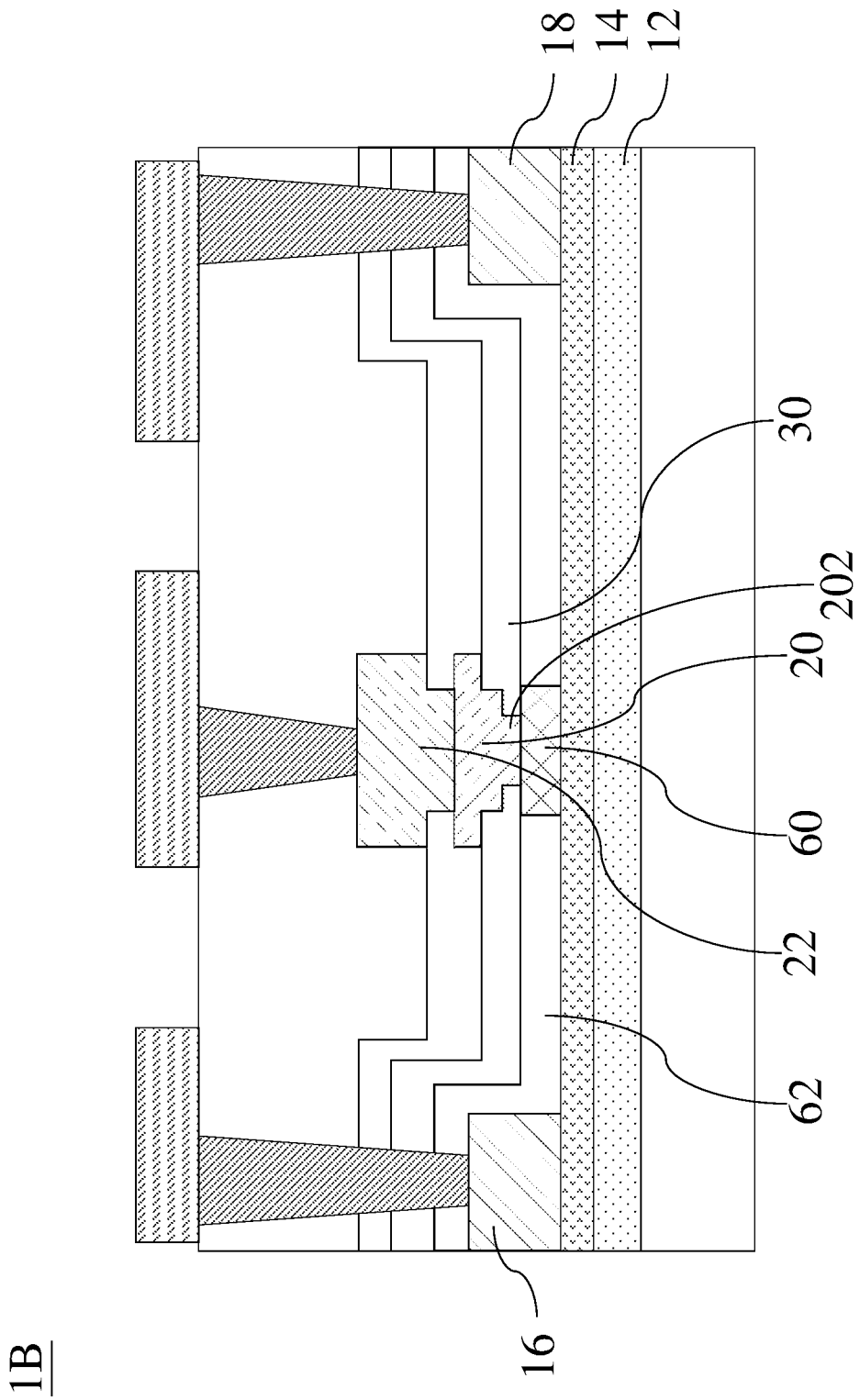
FIG. 4 is a vertical cross-sectional view of a semiconductor device according to some embodiments of the present disclosure.

FIG. 4 is a vertical cross-sectional view of a semiconductor device 1B according to some embodiments of the present disclosure. The semiconductor device 1B is similar to the semiconductor device 1A as described and illustrated with reference to FIG. 1A and FIG. 1B, except that a p-type doped nitride-based semiconductor layer 60 is introduced into the structure. The p-type doped nitride-based semiconductor layer 60 is disposed between the nitride-based semiconductor layer 14 and the gate electrode 20.

The semiconductor device 1B may further includes a dielectric layer 62 between the nitride-based semiconductor layer 14 and the dielectric layer 30. The dielectric layer 62 covers the electrodes 16 and 18. The p-type doped nitride-based semiconductor layer 60 is located within the dielectric layer 62. In some embodiments, the dielectric layers 30 and 62 are merged. To make the manufacturing process simple, the p-type doped nitride-based semiconductor layer 60 can be formed being wider than the gate bottom portion 202 of the gate electrode 20.

In the exemplary illustration of FIG. 4, the semiconductor device 1B is an enhancement mode device, which is in a normally-off state when the stacked gate-electrode structure is at approximately zero bias. Specifically, the p-type doped nitride-based semiconductor layer 60 may create at least one p-n junction with the nitride-based semiconductor layer 14 to deplete the 2DEG region, such that at least one zone of the 2DEG region corresponding to a position below the corresponding the stacked gate-electrode structure has different characteristics (e.g., different electron concentrations) than the rest of the 2DEG region and thus is blocked. Due to such mechanism, the semiconductor device 1B has a normally-off characteristic. In other words, when no voltage is applied to the stacked gate-electrode structure or a voltage applied to the stacked gate-electrode structure is less than a threshold voltage (i.e., a minimum voltage required to form an inversion layer below the stacked gate-electrode structure), the zone of the 2DEG region below the stacked gate-electrode structure is kept blocked, and thus no current flows therethrough.

In some embodiments, the p-type doped nitride-based semiconductor layer 60 can be omitted, such that the semiconductor device 1B is a depletion-mode device, which means the semiconductor device 1B in a normally-on state at zero gate-source voltage.

The p-type doped nitride-based semiconductor layer 60 can be a p-type doped III-V compound semiconductor layer. The exemplary materials of the p-type doped nitride-based semiconductor layer 60 can include, for example but are not limited to, p-doped group III-V nitride semiconductor materials, such as p-type GaN, p-type AlGaN, p-type InN, p-type AlInN, p-type InGaN, p-type AlInGaN, or combinations thereof. In some embodiments, the p-doped materials are achieved by using a p-type impurity, such as Be, Mg, Zn, Cd, and Mg. In some embodiments, the nitride-based semiconductor layer 12 includes undoped GaN and the nitride-based semiconductor layer 14 includes AlGaN, and the p-type doped III-V compound semiconductor layer 60 is a p-type GaN layer which can bend the underlying band structure upwards and to deplete the corresponding zone of the 2DEG region, so as to place the semiconductor device 1B into an off-state condition.

In the semiconductor devices 1A and 1B, the stacked gate-electrode structure can be compatible with different device structures/designs. The embodiments above show how to introduce the stacked gate-electrode structure into a HEMT device.

Based on the above description, in the present embodiments of the disclosure, the stacked gate-electrode structure includes lower and upper gate electrodes. The lower gate electrode can be formed from a thin blanket conductive layer such that it can avoid deformation of the blanket conductive layer during the deposition process. Accordingly, the occurrence of over etching can be reduced. The upper gate electrode can be formed to compensate the thickness of the stacked gate-electrode structure, such that the stacked gate-electrode structure can have the enough thickness, avoiding damaged when it is biased. As such, the yield rate of the semiconductor device is improved since the occurrence of the over etching can be reduced, and the thickness of the stacked gate-electrode structure remains.

The embodiments were chosen and described in order to best explain the principles of the invention and its practical application, thereby enabling others skilled in the art to understand the invention for various embodiments and with various modifications that are suited to the particular use contemplated.

As used herein and not otherwise defined, the terms "substantially," "substantial," "approximately" and "about" are used to describe and account for small variations. When used in conjunction with an event or circumstance, the terms can encompass instances in which the event or circumstance occurs precisely as well as instances in which the event or circumstance occurs to a close approximation. For example, when used in conjunction with a numerical value, the terms can encompass a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. The term "substantially coplanar" can refer to two surfaces within micrometers of lying along a same plane, such as within 40 µm, within 30 µm, within 20 µm, within 10 µm, or within 1 µm of lying along the same plane.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not necessarily be drawn to scale. There may be distinctions between the artistic renditions in the present disclosure and the actual apparatus due to manufacturing processes and tolerances. Further, it is understood that actual devices and layers may deviate from the rectangular layer depictions of the FIGS. and may include angles surfaces or edges, rounded corners, etc. due to manufacturing processes such as conformal deposition, etching, etc. There may be other embodiments of the present disclosure which are not specifically illustrated. The specification and the drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations.

The invention claimed is:

1. A nitride-based semiconductor device, comprising:
 a first nitride-based semiconductor layer;
 a second nitride-based semiconductor layer disposed on the first nitride-based semiconductor layer and having a bandgap greater than a bandgap of the first nitride-based semiconductor layer;
 a source electrode and a drain electrode disposed above the second nitride-based semiconductor layer;
 a first gate electrode disposed above the second nitride-based semiconductor layer and between the source electrode and the drain electrode and comprising:
  a first gate bottom portion; and
  a first gate top portion located over the first gate bottom portion and wider than the first gate bottom portion;
 a second gate electrode disposed above the first gate electrode and between the source electrode and the drain electrode and comprising:
  a second gate bottom portion in contact with the first gate top portion; and
  a second gate top portion located over the second gate bottom portion and wider than the second gate bottom portion; and a first dielectric layer extending from a top surface of the source electrode to a position beneath the first gate top portion.

2. The nitride-based semiconductor device of claim 1, wherein the first gate electrode further comprises a first gate middle portion between the first gate bottom portion and the first gate top portion, and the first gate middle portion is wider than the first gate bottom portion.

3. The nitride-based semiconductor device of claim 2, wherein the first gate middle portion is narrower than the first gate top portion.

4. The nitride-based semiconductor device of claim 2, wherein the second gate bottom portion has the same width as that of the first gate middle portion.

5. The nitride-based semiconductor device of claim 1, wherein the first gate top portion and the second gate top portion have substantially the same width.

6. The nitride-based semiconductor device of claim 1, wherein the first dielectric layer encloses the first gate electrode and forms a stepwise profile at an interface with the first gate electrode.

7. The nitride-based semiconductor device of claim 1, further comprising:
a second dielectric layer extending from a position above the source electrode to enclose the first gate top portion and the second gate bottom portion.

8. The nitride-based semiconductor device of claim 7, wherein the second dielectric layer has a portion extending to a region between the first gate top portion and second gate top portion.

9. The nitride-based semiconductor device of claim 1, wherein the second gate electrode is thicker than the first gate electrode.

10. The nitride-based semiconductor device of claim 1, wherein the first gate bottom portion has a height less than a height of the second gate bottom portion.

11. The nitride-based semiconductor device of claim 1, wherein the first gate bottom portion is in contact with the second nitride-based semiconductor layer.

12. The nitride-based semiconductor device of claim 1, further comprising:
a p-type doped nitride-based semiconductor layer disposed between the second nitride-based semiconductor layer and the first gate electrode.

13. The nitride-based semiconductor device of claim 12, wherein the p-type doped nitride-based semiconductor layer is wider than the first gate bottom portion.

14. The nitride-based semiconductor device of claim 1, wherein the second gate electrode is stacked on the first gate electrode and is in a position higher than the source electrode and the drain electrode.

15. A nitride-based semiconductor device, comprising:
a first nitride-based semiconductor layer;
a second nitride-based semiconductor layer disposed on the first nitride-based semiconductor layer and having a bandgap greater than a bandgap of the first nitride-based semiconductor layer;
a source electrode and a drain electrode disposed above the second nitride-based semiconductor layer;
a first gate electrode disposed above the second nitride-based semiconductor layer and between the source electrode and the drain electrode and comprising:
a first gate bottom portion;
a first gate top portion located over the first gate bottom portion and wider than the first gate bottom portion; and
a first gate middle portion between the first gate bottom portion and the first gate top portion, and the first gate middle portion is wider than the first gate bottom portion; and
a second gate electrode disposed above the first gate electrode and between the source electrode and the drain electrode and comprising:
a second gate bottom portion in contact with the first gate top portion, wherein the second gate bottom portion has the same width as that of the first gate middle portion; and
a second gate top portion located over the second gate bottom portion and wider than the second gate bottom portion.

16. A method for manufacturing a nitride-based semiconductor device, comprising:
forming a first nitride-based semiconductor layer on a substrate;
forming a second nitride-based semiconductor layer on the first nitride-based semiconductor layer;
forming a first dielectric layer over the second nitride-based semiconductor layer;
forming a first opening in the first dielectric layer to expose the second nitride-based semiconductor layer;
widening a top of the first opening such that first dielectric layer has a stepwise profile;
forming a first gate electrode over the first dielectric layer and having a portion within the first opening;
forming a second dielectric layer over the first gate electrode;
forming a second opening in the second dielectric; and
forming a second gate electrode over the second dielectric layer and having a portion within the second opening.

17. The method of claim 16, wherein forming the first opening in the first dielectric layer and forming the second opening in the second dielectric are performed by using the same reticle such that the first and second opening have the same width.

18. The method of claim 16, wherein forming the first gate electrode comprises:
forming a first blanket gate layer covering the first dielectric layer and filling into the first opening; and
patterning the first blanket gate layer by using a reticle.

19. The method of claim 18, wherein forming the second gate electrode comprises:
forming a second blanket gate layer covering the second dielectric layer and filling into the second opening; and
patterning the second blanket gate layer by using the reticle.

20. The method of claim 19, wherein the first blanket gate layer and the second blanket gate layer are patterned by the same reticle to form the first gate electrode and the second gate electrode having the same width.

* * * * *